United States Patent
Tanaka (10) Patent No.: US 9,929,455 B2
(45) Date of Patent: Mar. 27, 2018

(54) ELECTRONIC CIRCUIT

(71) Applicant: CANON KABUSHIKI KAISHA, Tokyo (JP)

(72) Inventor: Yu Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 14/636,056

(22) Filed: Mar. 2, 2015

(65) Prior Publication Data
US 2015/0270592 A1    Sep. 24, 2015

(30) Foreign Application Priority Data

Mar. 18, 2014    (JP) ................................. 2014-055614

(51) Int. Cl.
| | |
|---|---|
| *H01P 1/20* | (2006.01) |
| *H03H 7/01* | (2006.01) |
| *H03H 1/00* | (2006.01) |
| *H05K 1/02* | (2006.01) |

(52) U.S. Cl.
CPC ......... *H01P 1/2005* (2013.01); *H03H 1/0007* (2013.01); *H03H 7/01* (2013.01); *H05K 1/0236* (2013.01)

(58) Field of Classification Search
CPC ...... H03H 7/01; H03H 1/0007; H01P 1/2005; H05K 1/0236
USPC .......................................... 333/12, 181, 185
See application file for complete search history.

(56) References Cited

U.S. PATENT DOCUMENTS

| | | | |
|---|---|---|---|
| 7,939,907 B2 | 5/2011 | Osaka et al. | |
| 8,183,468 B2 | 5/2012 | Kim et al. | |
| 8,432,706 B2 | 4/2013 | Kim et al. | |
| 2007/0285336 A1* | 12/2007 | Kamgaing | H01Q 1/2258 343/895 |
| 2012/0325537 A1 | 12/2012 | Toyao et al. | |
| 2014/0029227 A1* | 1/2014 | Sasaki | H01L 24/19 361/783 |

FOREIGN PATENT DOCUMENTS

| | | |
|---|---|---|
| JP | 2008010859 A | 1/2008 |
| JP | 2008-288770 A | 11/2008 |
| JP | 2009021594 A | 1/2009 |
| JP | 2011-35367 A | 2/2011 |
| JP | 2012-004256 A | 1/2012 |
| WO | 2011/111314 A1 | 9/2011 |

OTHER PUBLICATIONS

Japanese Office Action dated Jan. 29, 2018, in Japanese Patent Application No. 2014-055614.

* cited by examiner

*Primary Examiner* — Rakesh Patel
(74) *Attorney, Agent, or Firm* — Fitzpatrick, Cella, Harper & Scinto (57) ABSTRACT

An electronic circuit includes: a substrate having an electromagnetic band gap structure formed including a ground conductor and a first conductor that includes multiple conductor plates, the conductor plates being arranged on a first surface, and at least a portion of the ground conductor being arranged on a second surface; and a second conductor that is arranged at a distance from and rearward of the conductor plates in a view from the second surface of the substrate, is connected to the ground conductor, and is electromagnetically coupled to at least a portion of the conductor plates.

10 Claims, 6 Drawing Sheets

ELECTRONIC CIRCUIT

BACKGROUND OF THE INVENTION

Field of the Invention

The present invention relates to an electronic circuit that has an electromagnetic band gap structure.

Description of the Related Art

In recent years, review has been underway on the use of metamaterials in the field of electromagnetic waves in antennas, microwave circuits, and the like. A metamaterial is, in a broad sense, an artificial substance that does not exist in the natural world, and is classified into one of three types, namely a left-handed material whose dielectric constant and magnetic permeability are simultaneously negative, a material having either a negative dielectric constant or a negative magnetic permeability, and a right-handed material whose dielectric constant and magnetic permeability are simultaneously positive. Among these, it is known that a material with either a negative dielectric constant or a negative magnetic permeability has an electromagnetic band gap (EBG) property of stopping the propagation of electromagnetic waves.

It is known that by manipulating the substance, shape, and alignment of unit elements, a material having the EBG property can be realized using materials that exist in the natural world. A periodic structure that has an EBG property arising from unit elements will be called an EBG structure hereinafter. In electronic circuits, an EBG structure can be used as a band-stop filter for cutting off a specific frequency band, such as electromagnetic noise that causes unnecessary radiation to be emitted from the substrate on which electronic components are mounted.

In general, change of the cut-off frequency is not easy due to the EBG structure being formed in the substrate or on the substrate. Also, there is known to be a trade-off relationship between the size of the unit elements and the cut-off frequency, that is to say, the unit element size increases the lower the cut-off frequency is designed.

Japanese Patent Laid-Open No. 2008-288770 discloses a technique for achieving both a reduction in the size of the EBG structure and the lowering of the cut-off frequency. In the technique disclosed in Japanese Patent Laid-Open No. 2008-288770, the size of the EBG structure is reduced using multiple chip inductors or chip capacitors. However, this configuration requires the number of electronic components to be increased by the number of patch structures, thus leading to the problem of an increase in manufacturing cost. There has also been the problem of difficulty in obtaining a desired cut-off frequency due to the electronic components having frequency characteristics rather than ideal characteristics.

The present invention has been achieved in light of the above-described circumstances, and an object of an aspect of the present invention is to provide an electromagnetic band gap structure that is small and whose cut-off frequency is adjustable.

SUMMARY OF THE INVENTION

According to one aspect of the present invention, there is provided an electronic circuit comprising: a substrate having an electromagnetic band gap structure formed including a ground conductor and a first conductor that includes a plurality of conductor plates, the plurality of conductor plates being arranged on a first surface, and at least a portion of the ground conductor being arranged on a second surface; and a second conductor that is arranged at a distance from and rearward of the plurality of conductor plates in a view from the second surface of the substrate, is connected to the ground conductor, and is electromagnetically coupled to at least a portion of the plurality of conductor plates.

According to another aspect of the present invention, there is provided an electronic circuit comprising: a substrate configured including a first conductor on a first surface; and a second conductor that is arranged at a distance from the first conductor, is electromagnetically coupled to the first conductor, is connected to a ground conductor formed on the first surface, and forms an electromagnetic band gap structure along with the substrate.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

Note that in the figures, the properties of materials are distinguished from each other by the patterns of hatching in the respective regions. Also, there are cases where elements having a repeating structure are not indicated by reference numbers in the figures, but the structures of these elements are the same as the structures in other locations in the repeating unit.

Figure 8A:
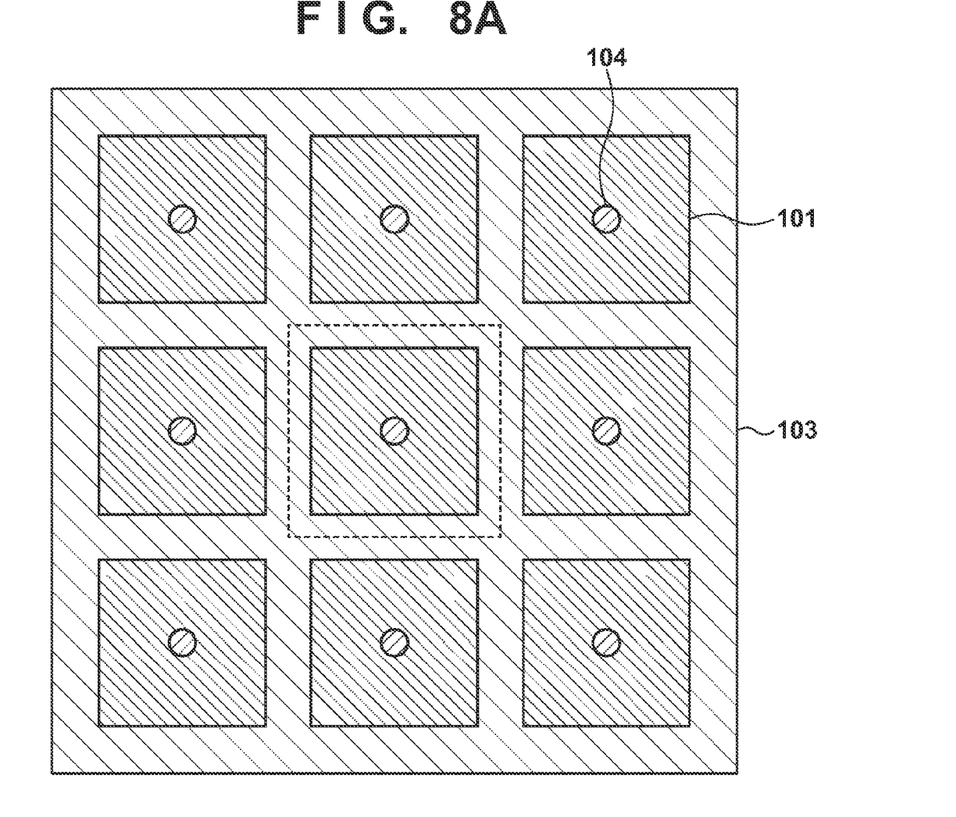
FIGS. 8A and 8B are respectively a front view and a cross-sectional diagram of a substrate having an EBG structure.
Figure 8B:
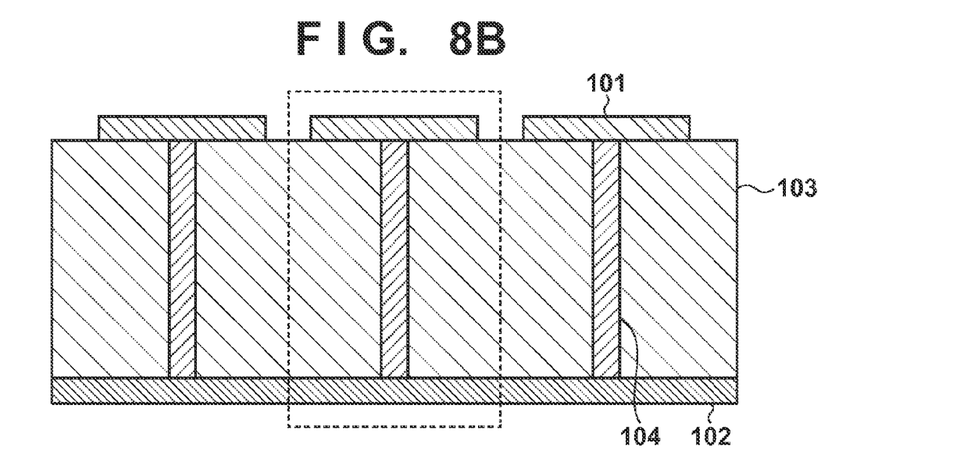

First, an ordinary electromagnetic band gap structure will be described before describing an electromagnetic band gap structure of the present embodiment. FIGS. 8A and 8B are respectively a front view and a cross-sectional diagram of a double-sided substrate having a generally-known electromagnetic band gap structure (EBG structure). This substrate is a dielectric substrate, for example, and FIGS. 8A and 8B show a state in which multiple conductor plates (conductor patches) 101 are arranged on one surface (the upper surface) of the substrate, and a ground conductor 102 is arranged on the opposite surface (the lower surface). Note that this EBG structure is incorporated as part of an electronic circuit in an electronic device, and carries out a function of preventing unnecessary electromagnetic wave radiation, for example. The conductor plates 101 are arranged with constant intervals therebetween, and are each grounded to the ground conductor 102 by an interlayer via 104 that penetrates a dielectric 103.

Figure 9:
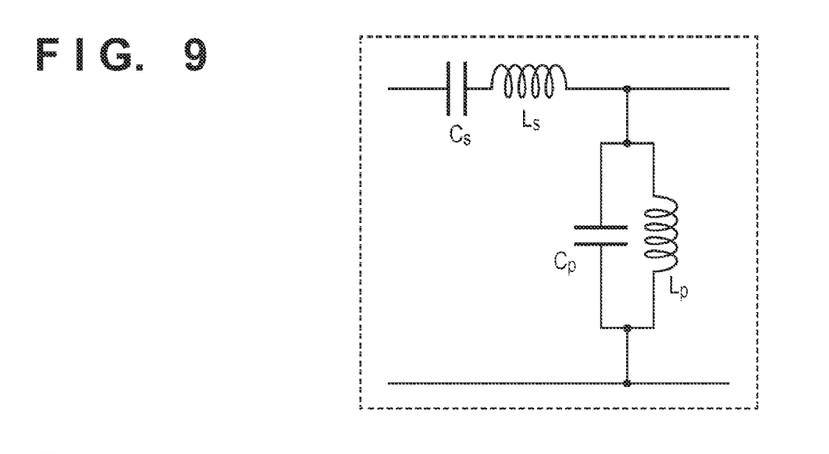
FIG. 9 is an equivalent circuit diagram of a unit element of an EBG structure.

FIG. 9 shows an equivalent circuit of the EBG structure in FIGS. 8A and 8B. The EBG structure in FIGS. 8A and 8B can be represented by a combination of a serial circuit and a parallel circuit each including a capacitor and an inductor as shown in FIG. 9. The cut-off frequency band of this EBG structure is from a resonance frequency $f_{se}$ of the serial circuit to a resonance frequency $f_{sh}$ of the parallel circuit. Note that these resonance frequencies are obtained as shown below.

$$f_{se} = \frac{1}{2\pi\sqrt{L_s C_s}}$$

$$f_{sh} = \frac{1}{2\pi\sqrt{L_p C_p}}$$

Also note that as shown in FIG. 9, $C_s$ and $L_s$ respectively indicate the capacitance and inductance of the serial circuit, and $C_p$ and $L_p$ respectively indicate the capacitance and inductance of the parallel circuit.

In the present embodiment, the cut-off frequency is changed by further adding conductors to the substrate having this EBG structure. Accordingly, the cut-off frequency can be adjusted without changing the size of the conductor plates 101, and the size of the EBG structure can be suppressed to a small size, thus making it possible to lower the resonance frequency of the electronic circuit as well. The following describes several examples of configurations.

Configuration Example 1

Figure 1:
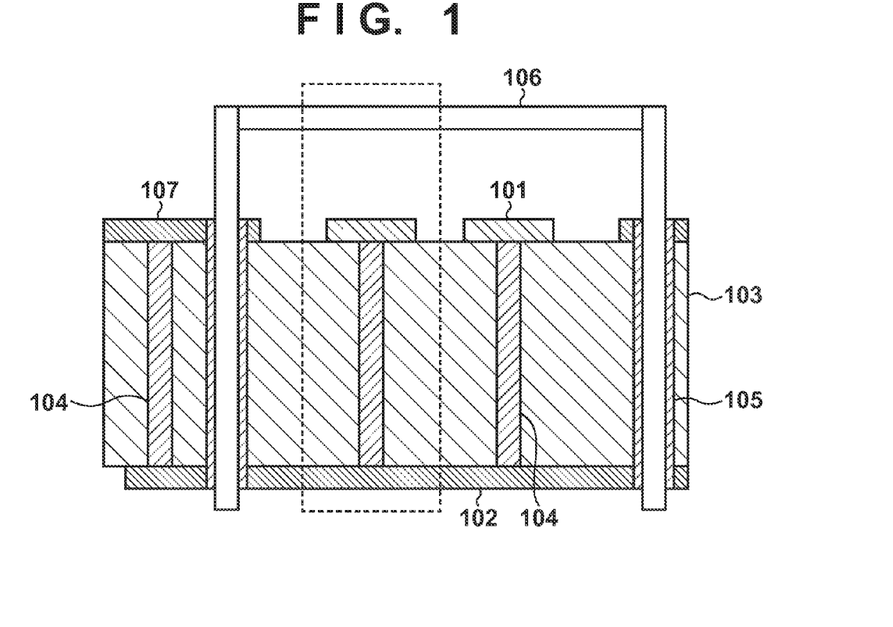
FIG. 1 is a cross-sectional diagram of a first example of the configuration of a substrate having an EBG structure according to an embodiment.

FIG. 1 is a cross-sectional diagram of a first example of the configuration of a substrate having an EBG structure in the present embodiment. A conductor 107 arranged on a first surface of the substrate is connected to the ground conductor 102 by the interlayer via 104. Also, an additional conductor 106 is arranged above the substrate (behind the conductor plates 101 with respect to the direction from the surface provided with the ground conductor 102 toward the surface provided with the conductor plates 101) at a distance from the conductor plates 101. The ends of the additional conductor 106 are bent at right angles and grounded to the ground conductor 102 through through-holes 105. Note that the additional conductor 106 and at least some of the conductor plates 101 are electromagnetically coupled.

Figure 2:
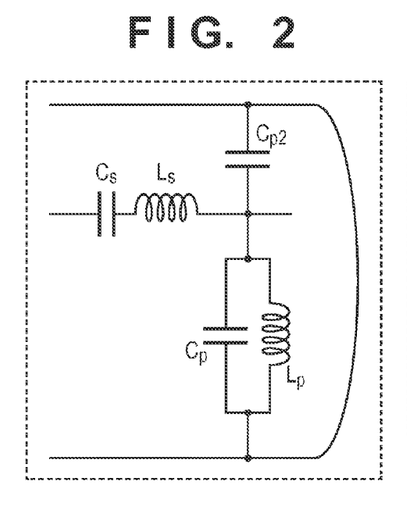
FIG. 2 is an equivalent circuit diagram of a unit element of the first example of the configuration of the substrate having an EBG structure.

Here, the unit element forming the EBG structure can be thought of as the portion enclosed by dashed lines in the figure, in which one of the conductor plates 101 is sandwiched by the ground conductor 102 and the additional conductor 106. FIG. 2 shows an equivalent circuit of this unit element. As shown in FIG. 2, the equivalent circuit of the unit element in this configuration example has a configuration in which a capacitor component $C_{p2}$ is connected to the circuit configuration shown in FIG. 9. Note that the capacitor component $C_{p2}$ is obtained by the electromagnetic coupling between the one conductor plate 101 and the additional conductor 106.

Figure 3:
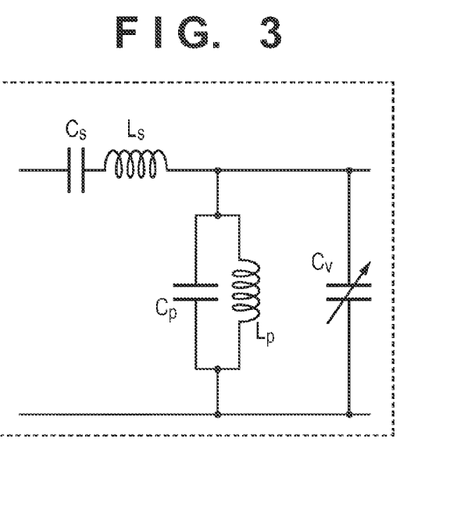
FIG. 3 is an equivalent circuit diagram of an EBG structure according to an embodiment.

The value of $C_{p2}$ changes according to the material making up the additional conductor 106 and the distance between the additional conductor 106 and the conductor plates 101 when the additional conductor 106 is provided. FIG. 3 is a diagram showing the case where the equivalent circuit of the unit element is generalized taking this change into consideration. As can be understood from FIG. 3, since $C_v$ is the parallel component, the resonance frequency $f_{sh}$ of the parallel circuit can be changed by changing $C_v$. Specifically, by raising $C_v$ of the parallel circuit, it is possible to lower the cut-off frequency of the EBG structure without increasing the size of the conductor plate 101 constituting the unit element. Note that the additional conductor 106 does not need to be implemented on the substrate in advance, and may have a detachable configuration so as to be able to be added in the case of a desire to change the cut-off frequency of an EBG structure provided on a double-sided substrate.

Configuration Example 2

Figure 4:
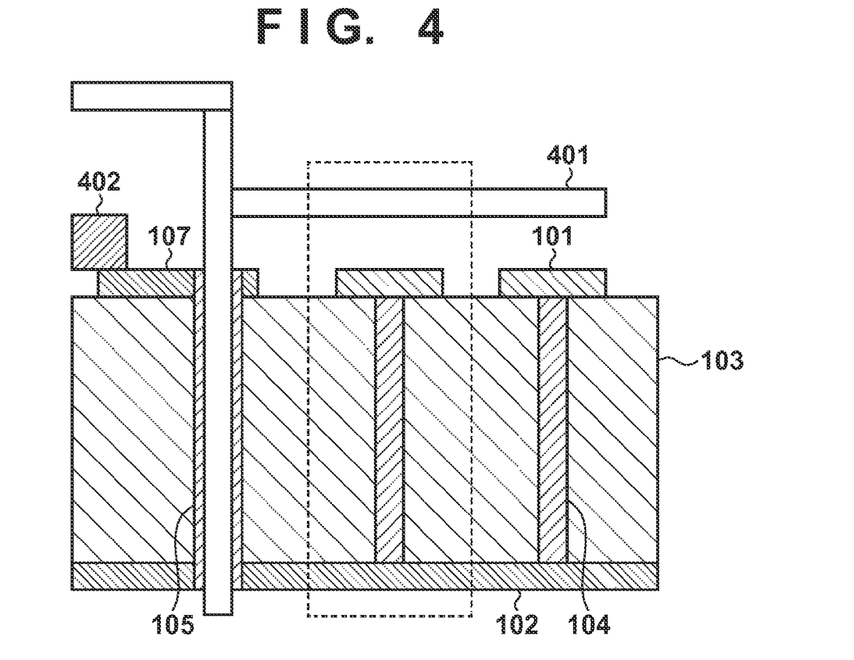
FIG. 4 is a cross-sectional diagram of a second example of the configuration of a substrate having an EBG structure according to an embodiment.

FIG. 4 is a cross-sectional diagram of a second example of the configuration of a substrate having an EBG structure in the present embodiment. The configuration of the substrate and elements indicated by the same reference numbers are the same as those in the first configuration example, and will not be described in detail.

This configuration example differs from the first configuration example in that an additional conductor 401 is connected to the substrate, and an electronic component 402 is implemented on the first surface of the substrate (on the conductor 107). In addition to having the function of changing the cut-off frequency as in the example of the first configuration example, the additional conductor 401 also functions as a shielding case that prevents the radiation of electromagnetic noise generated by the substrate and the electronic component 402. To achieve this, the additional conductor 401 is made of a metal such as nickel silver, and is formed so as to cover the electronic component 402 on the surface where the electronic component 402 is implemented. Furthermore, the conductor end of the additional conductor 401 is bent at a right angle and grounded to the ground conductor 102 through a through-hole 105. Note that since the additional conductor 401 functions as a shielding case that covers the majority of the electronic components, the substrate end can be grounded. An ungrounded portion of the bent additional conductor 401 is again bent at a right angle above the substrate so as to cover the conductor plates 101, for example.

Here, the unit element having the EBG structure can be thought of as the portion enclosed by dashed lines in the figure, in which one of the conductor plates 101 is sandwiched by the ground conductor 102 and the additional conductor 401. The equivalent circuit of the unit element of this configuration example is shown in FIG. 3 likewise to the first configuration example, and $C_v$ is the capacitor component formed by electromagnetic coupling between the one conductor plate 101 and the additional conductor 401. For this reason, the cut-off frequency $f_{sh}$ can be easily changed by changing the shape, height, or material of the bent portion of the additional conductor 401.

Note that in this configuration example, the EBG structure is obtained by the combination of the additional conductor 401 and the substrate configuration, and therefore in addition to the substrate, electromagnetic waves cannot propagate to the additional conductor 401 either. As a result, the substrate can not only prevent the radiation of electromagnetic noise generated by the substrate itself and the electronic component 402, but can also prevent the shielding case itself from becoming a secondary radiation source due to resonation of the additional conductor 401.

Figure 5:
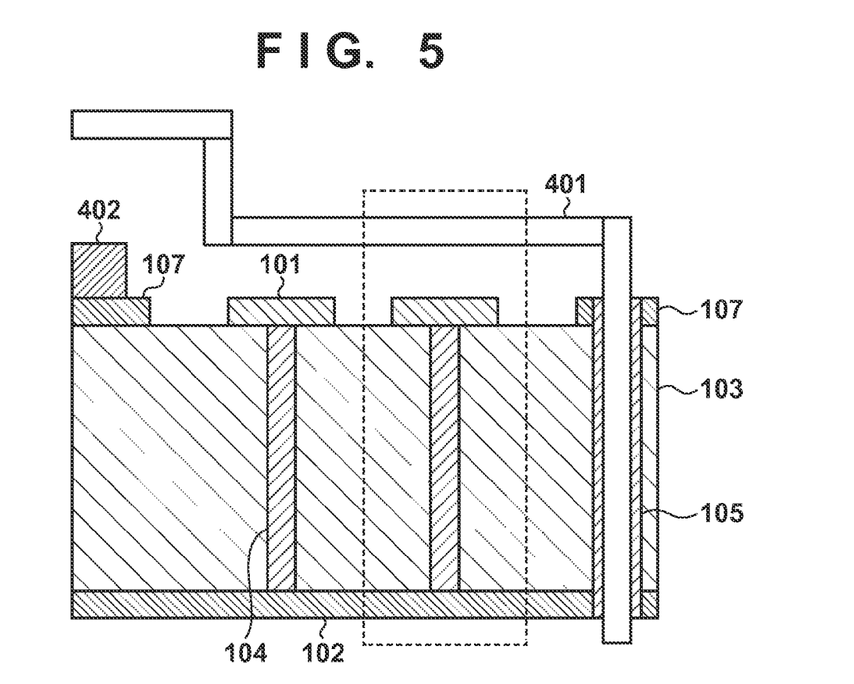
FIG. 5 is a cross-sectional diagram of a modification of the second example of the configuration of a substrate having an EBG structure.

Note that although a configuration in which the additional conductor 401 is sandwiched between the EBG structure and the electronic component 402 is shown in FIG. 4, this configuration example is not limited to this configuration. FIG. 5 shows another example of the configuration of the electronic circuit in the case of using the additional conductor 401 that functions as a shielding case. In the example shown in FIG. 5, the number of bends in the additional conductor 401 is higher, but according to this configuration, the grounded surface area of the additional conductor 401 is increased, and the additional conductor 401 does not easily become deformed.

Note that although the EBG structure is formed by bending the additional conductor 401 in this configuration example, the cut-off frequency of the EBG structure can be similarly changed by connecting a detachable additional conductor to a shielding case implemented on the substrate.

Note that the additional conductors 106 and 401 in the first and second configuration examples described above are not necessarily required to pass through the through-holes 105, and may be grounded to the ground conductor by another method. For example, the additional conductor 106 or 401 may be grounded to the conductor 107 on the upper surface of the substrate that is connected to the ground conductor 102 by the interlayer via 104 or the through-hole 105.

Note that by forming the additional conductor 106 or 401 as a parallel flat plate-shaped conductor plate that covers the conductor plates 101, for example, it is possible to stably obtain electromagnetic coupling with the conductor plates 101. Also, the additional conductor 106 or 401 does not need to cover all of the conductor plates 101, and may be configured so as to cover at least some of the conductor plates 101. Furthermore, the cut-off frequency can be adjusted by adjusting the surface area or number of conductor plates 101 covered by the additional conductor 106 or 401.

Note that by forming the additional conductor 106 or 401 as a conductor plate, the grounded surface area can be increased by bending. Employing this shape therefore makes it possible to realize stable grounding.

Note that there are no limitations on the shape of and material making up of the additional conductors 106 and 401, and a metal film with an insulated sheet may be used, for example.

Configuration Example 3

Figure 6:
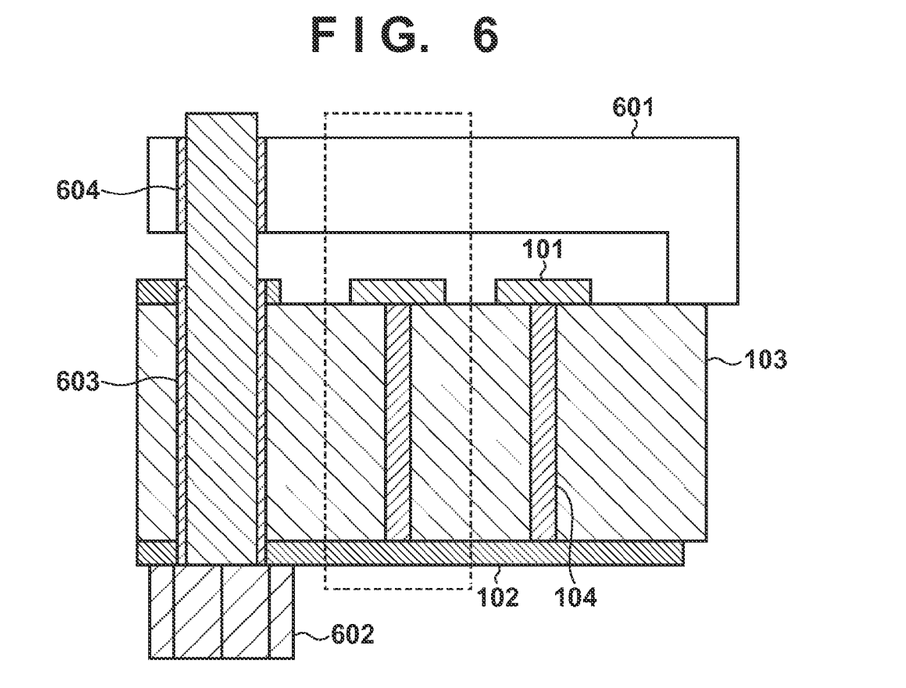
FIG. 6 is a cross-sectional diagram of a third example of the configuration of a substrate having an EBG structure according to an embodiment.

FIG. 6 is a cross-sectional diagram of a third example of the configuration of a substrate having an EBG structure in the present embodiment. The configuration of the substrate and elements indicated by the same reference numbers are the same as those in the first and second configuration examples, and will not be described in detail.

Unlike the first and second configuration examples, the substrate is fixed to a conductor 601, which is a support member, by a conductor 602. The conductor 602 is a thread for example; a threaded hole 603 is provided in the dielectric 103, and a threaded hole 604 is provided in the conductor 601 serving as a support member. Note that the types of these members (conductors) are not limited as long as they are members used to support the substrate.

Normally, in the case where the substrate is attached to the support member by a thread, besides the fixation of the substrate, there is expectation for an effect of allowing heat to escape to the support member. Here, the unit element having the EBG structure can be thought of as the portion enclosed by dashed lines in the figure, in which one of the conductor plates 101 is sandwiched by the ground conductor 102 and the conductor 601 serving as a support member.

The equivalent circuit of the unit element of this configuration example is shown in FIG. 3 likewise to the first and second configuration examples, and $C_v$ is the capacitor component formed by electromagnetic coupling between the one conductor plate 101 and the conductor 601 serving as a support member. Accordingly, the cut-off frequency can be changed by changing the distance (positional relationship) between the conductor 601 serving as a support member and the conductor plates 101. As a result, the substrate can not only prevent the radiation of electromagnetic noise generated by the substrate itself and an electronic component (not shown), but also prevent the radiation of electromagnetic noise from the support member and allow heat generated by the substrate to escape to the support member.

Note that although the case of using a double-sided substrate is described as an example in the first to third configuration examples, a similar configuration can be applied to a substrate configuration having multiple layers as well. In this case, the EBG structure is formed in accordance with the conductors formed in the various layers, the line paths in the layers, and the vias connecting the layers.

Figure 10A:
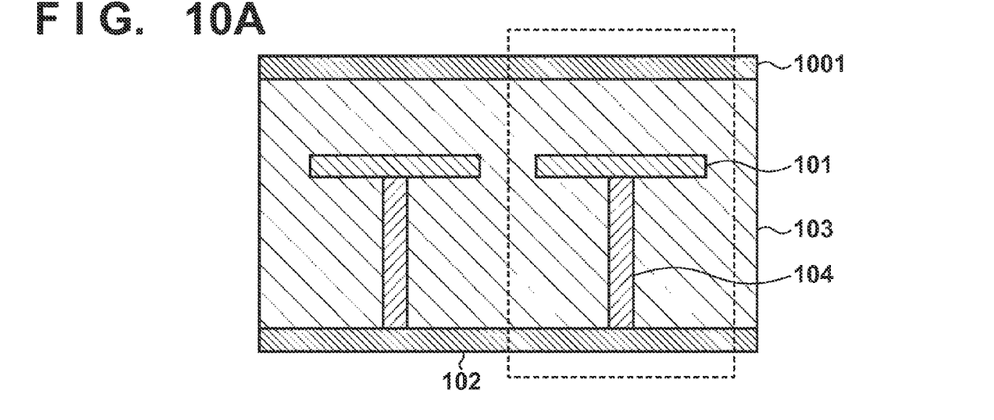
FIGS. 10A and 10B are respectively a cross-sectional diagram and an equivalent circuit diagram of a substrate having an EBG structure.
Figure 10B:
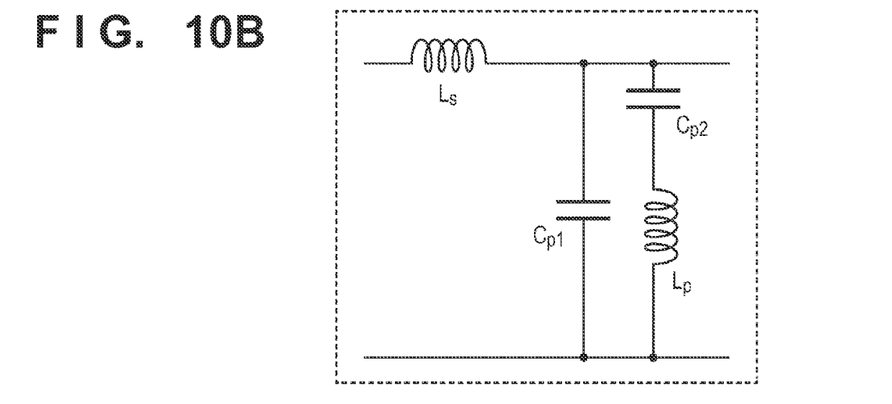
Figure 11A:
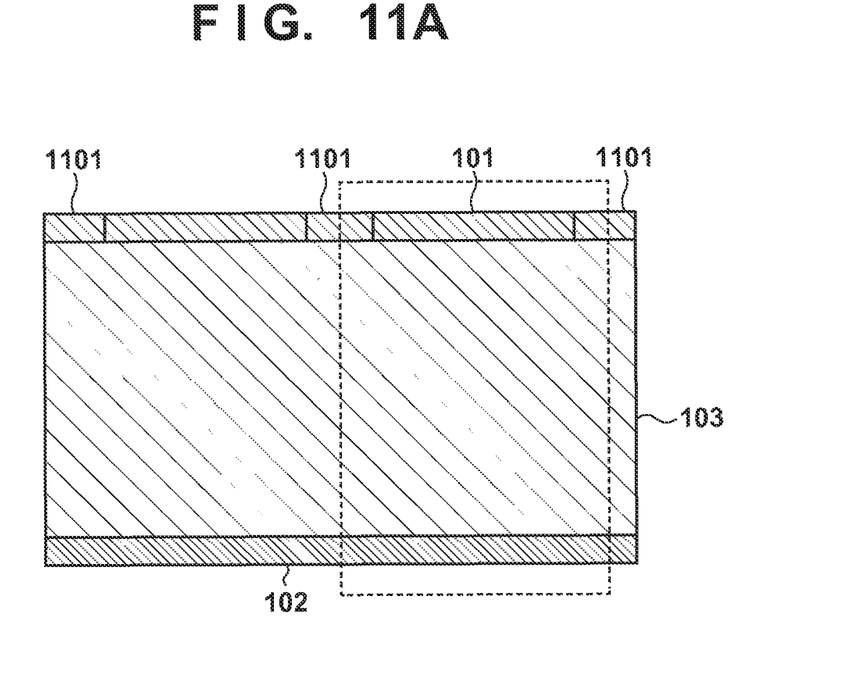
FIGS. 11A and 11B are respectively a cross-sectional diagram and an equivalent circuit diagram of a substrate having an EBG structure.
Figure 11B:
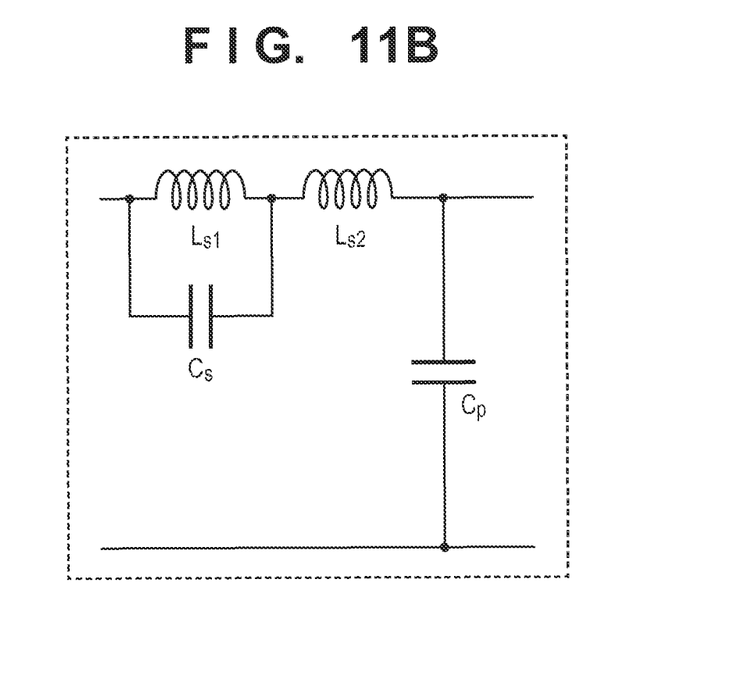

The EBG structure of the present embodiment can be formed by adding an additional conductor to a substrate configuration other than the substrate configuration shown in FIGS. 8A and 8B. FIGS. 10A and 11A show substrate configurations different from the substrate configuration shown in FIGS. 8A and 8B, and FIGS. 10B and 11B show equivalent circuits for these substrate configurations. In FIGS. 10A and 10B, the structure has a third surface that is provided with a conductor 1001 and is located behind the first surface provided with the conductor plates 101 in a view from the second surface provided with the ground conductor 102. Also, the space between the second surface and the third surface is filled with a dielectric. FIGS. 11A and 11B show a structure in which the interlayer vias 104 are not provided, and the conductor plates 101 are connected to each other by a conductor 1101. The substrate configuration shown in FIGS. 10A and 10B and the substrate configuration shown in FIGS. 11A and 11B have different equivalent circuits from the equivalent circuit shown in FIG. 9 due to being different substrate configurations from the substrate configuration shown in FIGS. 8A and 8B, but they are known to have an EBG structure. The cut-off frequency can be controlled for a substrate having this type of EBG structure as well, by using an additional conductor (support member conductor) and electromagnetically coupling this additional conductor to the conductor plate having an EBG structure.

Configuration Example 4

Figure 7:
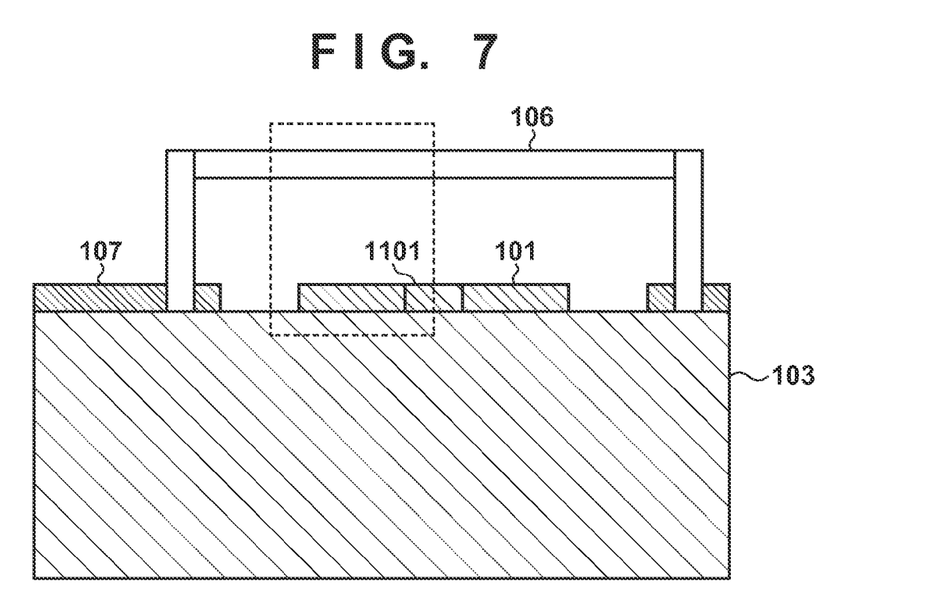
FIG. 7 is a cross-sectional diagram of a substrate having an EBG structure that employs a single-sided substrate.

FIG. 7 is a cross-sectional diagram of a fourth example of the configuration of a substrate having an EBG structure in the present embodiment. The configuration of the substrate and elements indicated by the same reference numbers are the same as those in the first to third configuration examples, and will not be described in detail. Unlike the substrates in the first to third configuration examples, the substrate of this configuration example is a single-sided substrate and is made up of a layer in which conductors are formed and a dielectric layer, and therefore does not have the ground conductor 102, the interlayer vias 104, or the through-holes 105.

In this configuration example, multiple conductor plates 101, a conductor 107 (ground conductor), and a conductor 1101 are arranged on a first surface (the upper surface) of the substrate, the conductor plates 101 are connected to each other by the conductor 1101, and the substrate configuration is similar to the configuration shown in FIGS. 11A and 11B. Also, the additional conductor 106 is arranged above the single-sided substrate, and the conductor end is bent at a right angle and grounded to the conductor 107.

Here, the unit element having the EBG structure can be thought of as the portion enclosed by dashed lines in the figure, which is sandwiched by the one conductor plate 101 and the additional conductor 106. Accordingly, the equivalent circuit of the unit element of this configuration example has a configuration in which a capacitor component $C_v$ is connected to the circuit configuration shown in FIG. 11, in parallel with the capacitor $C_p$. This configuration example is different from the other configuration examples in that the EBG structure is first obtained once the additional conductor 106 has been implemented, and according to this configuration, the cut-off frequency of the EBG structure can be changed with a single-sided substrate as well.

Note that although a double-sided substrate and a single-sided substrate are used in the first to fourth configuration examples, the substrate need only be a printed circuit board, and there is no limitation on the material thereof. Also, although the conductor plates 101 have a rectangular shape in FIGS. 8A and 8B, they may have another polygonal shape or circular shape. Furthermore, the conductor plates 101 are not necessarily required to be aligned with equal intervals, and the conductor plates 101 do not all need to be the same size. For example, since attenuation in the cut-off frequency is determined according to the application, the arrangement of the unit elements having the EBG structure may be changed as appropriate in order to achieve the required attenuation. Furthermore, there is no limitation on the shape of the additional conductors 106 and 401 and the conductor 601, and any shape may be used as long as electromagnetic coupling with the conductor plates 101 is achieved, and a capacitor component is formed.

According to the present invention, it is possible to realize an electromagnetic band gap structure that is small and whose cut-off frequency is adjustable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-055614, filed Mar. 18, 2014, which is hereby incorporated by reference herein in its entirety.

What is claimed is:

1. An electronic circuit, comprising:
a substrate having an electromagnetic band gap structure formed including a ground conductor and a plurality of conductor plates, the plurality of conductor plates being arranged on a first surface of the substrate, and at least a portion of the ground conductor being arranged on a second surface of the substrate;
a second conductor that is arranged at a distance from and rearward of at least a portion of the plurality of conductor plates in a view from the second surface to the first surface of the substrate, wherein the second conductor is connected to the ground conductor and is electromagnetically coupled to at least a portion of the plurality of conductor plates, and
wherein the electronic circuit has a configuration that is adjustable so as to change a positional relationship between the second conductor and the plurality of conductor plates, and
wherein the second conductor is formed to cover another electronic component arranged on the first surface of the substrate and functions as a shielding case for the another electronic component.

2. An electric circuit comprising:
a substrate having an electromagnetic band gap structure formed including a ground conductor and a plurality of conductor plates, the plurality of conductor plates being arranged on a first surface of the substrate, and at least a portion of the ground conductor being arranged on a second surface of the substrate; and
a second conductor that is arranged at a distance from and rearward of at least a portion of the plurality of conductor plates in a view from the second surface to the first surface of the substrate, wherein the second conductor is connected to the ground conductor and is electromagnetically coupled to at least a portion of the plurality of conductor plates,
wherein the second conductor is formed to cover another electronic component arranged on the first surface of the substrate and functions as a shielding case for the another electronic component, and
wherein the second conductor is configured so as to be detachable from the substrate.

3. An electronic circuit comprising:
a substrate having an electromagnetic band gap structure formed including a ground conductor and a plurality of conductor plates, the plurality of conductor plates being arranged on a first surface of the substrate, and at least a portion of the ground conductor being arranged on a second surface of the substrate;
a second conductor that is arranged at a distance from and rearward of at least a portion of the plurality of conductor plates in a view from the second surface to the first surface of the substrate, is connected to the ground conductor, and is electromagnetically coupled to at least a portion of the plurality of conductor plates, and
a configuration that is adjustable so as to change a positional relationship between the second conductor and the plurality of conductor plates.

4. The electronic circuit according to claim 3, wherein the electromagnetic band gap structure is shaped such that the ground conductor is formed on the second surface of the substrate, and the plurality of conductor plates are connected to the ground conductor by a conductor that penetrates from the first surface to the second surface of the substrate.

5. The electronic circuit according to claim 3, wherein the electromagnetic band gap structure is shaped such that the plurality of conductor plates are connected to each other on the first surface of the substrate.

6. The electronic circuit according to claim 3, wherein the substrate is a dielectric substrate.

7. An electronic circuit comprising:
   a substrate having an electromagnetic band gap structure formed including a ground conductor and a plurality of conductor plates, the plurality of conductor plates being arranged on a first surface of the substrate, and at least a portion of the ground conductor being arranged on a second surface of the substrate; and
   a second conductor that is arranged at a distance from and rearward of at least a portion of the plurality of conductor plates in a view from the second surface to the first surface of the substrate, is connected to the ground conductor, and is electromagnetically coupled to at least a portion of the plurality of conductor plates,
   wherein the second conductor is configured so as to be detachable from the substrate.

8. The electronic circuit according to claim 7, wherein the electromagnetic band gap structure is shaped such that the ground conductor is formed on the second surface of the substrate, and the plurality of conductor plates are connected to the ground conductor by a conductor that penetrates from the first surface to the second surface of the substrate.

9. The electronic circuit according to claim 7, wherein the electromagnetic band gap structure is shaped such that the plurality of conductor plates are connected to each other on the first surface of the substrate.

10. The electronic circuit according to claim 7, wherein the substrate is a dielectric substrate.

* * * * *